(12) United States Patent
Ju

(10) Patent No.: US 7,530,815 B2
(45) Date of Patent: May 12, 2009

(54) PRESS-FIT DEVICE FOR CONNECTING TWO ELECTRONIC COMPONENTS

(75) Inventor: Ted Ju, Keelung (TW)

(73) Assignee: Lotes Co., Ltd., Keelung (TW)

( * ) Notice: Subject to any disclaimer, the term of this patent is extended or adjusted under 35 U.S.C. 154(b) by 0 days.

(21) Appl. No.: 11/723,562

(22) Filed: Mar. 21, 2007

(65) Prior Publication Data
US 2008/0233793 A1  Sep. 25, 2008

(51) Int. Cl.
*H01R 12/00* (2006.01)
(52) U.S. Cl. .......................................... 439/67
(58) Field of Classification Search ............... 439/67, 439/329, 77
See application file for complete search history.

(56) References Cited

U.S. PATENT DOCUMENTS

| | | | | |
|---|---|---|---|---|
| 3,573,345 A | * | 4/1971 | Devries et al. | 174/254 |
| 3,629,787 A | * | 12/1971 | Wilson | 439/67 |
| 4,477,137 A | * | 10/1984 | Ayer | 439/590 |
| 4,770,645 A | * | 9/1988 | Antes | 439/329 |
| 4,993,958 A | * | 2/1991 | Trobough et al. | 439/67 |
| 5,499,924 A | * | 3/1996 | Arisaka et al. | 439/67 |
| 5,730,619 A | | 3/1998 | Hamlin | |
| 5,752,851 A | | 5/1998 | Zaderej et al. | |
| 5,971,772 A | * | 10/1999 | Wang et al. | 439/67 |
| 6,045,396 A | | 4/2000 | Tighe | |
| 6,336,816 B1 | * | 1/2002 | Yatskov et al. | 439/67 |
| 6,595,796 B1 | * | 7/2003 | Koegel et al. | 439/495 |
| 6,960,094 B2 | * | 11/2005 | Tomonari et al. | 439/329 |
| 7,094,067 B2 | * | 8/2006 | Kitagawa | 439/67 |
| 7,261,570 B1 | * | 8/2007 | Polnyi et al. | 439/67 |
| 2004/0018767 A1 | * | 1/2004 | Buck et al. | 439/329 |

* cited by examiner

*Primary Examiner*—T C Patel
*Assistant Examiner*—Vladimir Imas
(74) *Attorney, Agent, or Firm*—Rosenberg, Klein & Lee

(57) ABSTRACT

A press-fit device is used for connecting two electronic components, a plurality of conductive substrates are set on a surface of a first electronic component, and a contact area is set on a second electronic component corresponding to the conductive substrates. The press-fit device includes a fixing plate, a press-fit piece and a fixing plate. The fixing plate is fixed on the first electronic component, the press-fit piece is assembled with the fixing plate, and the flexible insulator is set between the press-fit piece and the second electronic component. When pressed, the press-fit piece presses the flexible insulator and further presses flexibly the contact area of the second electronic component and the conductive substrate of the first electronic component. The electronic connection between the first electronic component and the second electronic component performs well, and operation is easy, while assembly and disassembly are also easy.

13 Claims, 3 Drawing Sheets

PRESS-FIT DEVICE FOR CONNECTING TWO ELECTRONIC COMPONENTS

BACKGROUND OF THE INVENTION

1. Field of the Invention

The present invention relates to a press-fit device, and more specifically to a press-fit device for connecting two electronic components, such as a circuit board and a flexible wire.

2. Description of the Prior Art

Currently there are many types of connecting devices used for connecting flexible cables and circuit boards, such as a connecting device, which connects with a circuit board by a screw or a locating pole and a fixing block set under the circuit board, thereby, the cable can be clamped between the connecting device and the circuit board. For example, U.S. Pat. No. 6,045,396 discloses a connector, which includes a strain relief clamp and a pair of screws set on two ends of the strain relief. The screws fasten the strain relief clamp, and thus the cable wire and the circuit board are connected electronically by the fastening force of the strain relief clamp. However, the strain relief clamp used for the connector is fastened only by the two screws set on the two ends. This design makes the assembly and disassembly steps complicated, and the distribution of the fastening force is large at both ends and small in the middle, so the force between the cable wire and the circuit board is unequal. Moreover, the height of the connector cannot be reduced because of the screws.

Furthermore, U.S. Pat. No. 5,730,619 discloses a design in which posts are set on two ends of a mounting bar, button tops are set on a bottom end of the posts, and grooves are set on a circuit board corresponding to the posts. The posts are set in the grooves of the circuit board and fixed by a slide locking bar with slots. The mounting bar and the circuit board are fixed together to contain cables. However, the connecting structure is complicated, and the height of the entire structure cannot be reduced because of the posts and the slide locking bar.

Another connecting device defines an elongated main body to clamp two circuit boards. Catches are set on both ends of the elongated main body to clamp with both side bottoms of the circuit board. Two guide pins are set inside the two catches respectively to engage with guiding holes set on the circuit board. Through this design, the cable can be set between two circuit boards, as disclosed in U.S. Pat. No. 5,752,851. The structure disclosed is simple; however, the clamping force is large at both ends and small in the middle, causing the force of the electronic connection between the cable and the circuit boards to be unequal.

Hence, the inventors of the present invention believe that these shortcomings above are able to be improved upon and suggest the present invention which is of a reasonable design and is an effective improvement based on deep research and thought.

SUMMARY OF THE INVENTION

An object of the present invention is to provide a press-fit device for connecting two electronic components to set a good electronic connection between the two electronic components. Operating the device is easy, as is assembly and disassembly.

To achieve the above-mentioned object, a press-fit device for connecting two electronic components is disclosed. A plurality of conductive substrates are set on the surface of a first electronic component, and a contact area is set on a second electronic component corresponding to the conductive substrates. The press-fit device comprises a fixing plate fixed on the first electronic component, a press-fit piece assembled with the fixing plate, and a flexible insulator set between the press-fit piece and the second electronic component. When pressed, the press-fit piece presses the flexible insulator and further presses elastically the contact area of the second electronic component and the conductive substrate of the first electronic component.

Wherein, the first electronic component is a circuit board, the second electronic component is a wire, and an axis is defined on the press-fit piece to provide a pressing and rotating force to the fixing plate.

Advantages of the present invention:

1. Via the structure of the fixing plate and the press-fit piece, the press-fit piece provides equal clamping force to clamp the wire as the second electronic component with the circuit board as the first electronic component, thus, the electronic connection between the first and the second electronic components perform well.
2. The rotatable axis of the press-fit piece is defined on the fixing plate, so operation is easy, and assembly or disassembly are also easy, distortion or ruptures won't occur due to the continual pull acted upon the press-fit piece, so the fixation effect cannot be adversely affected.
3. The flexible insulator is set between the second electronic component and the press-fit piece, so that the electronic contact of the second electronic component and the first electronic component is closer, and the force is more equal.

To further understand the features and technical contents of the present invention, please refer to the following detailed description and drawings related to the present invention. However, the drawings are only to be used as references and explanations, and not to limit the present invention.

DETAILED DESCRIPTION OF THE INVENTION

Figure 1:
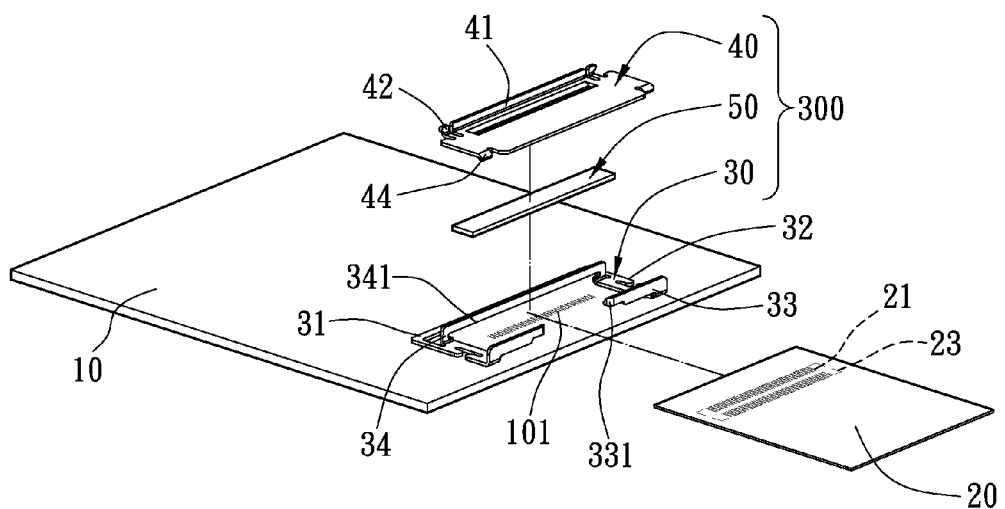
FIG. 1 is an exploded isometric view of the present invention.

Referring to FIG. 1, a press-fit device 300, which is used to connect two electronic components is shown. A first electronic component 10 is connected electronically with a second electronic component 20 by the press-fit device 300. The first electronic component 10 may be a circuit board. It may also be another electronic component such as an electric connector. The second electronic component 20 is a flexible cable. For the figures of the present invention, the first electronic component 10 is a circuit board.

Figure 2:
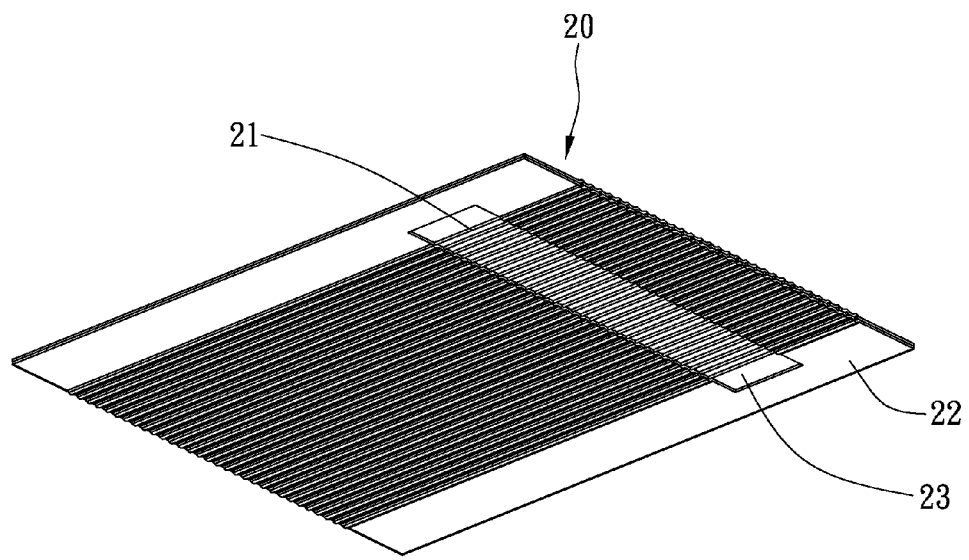
FIG. 2 is an isometric view of the second electronic component of the present invention.
Figure 3:
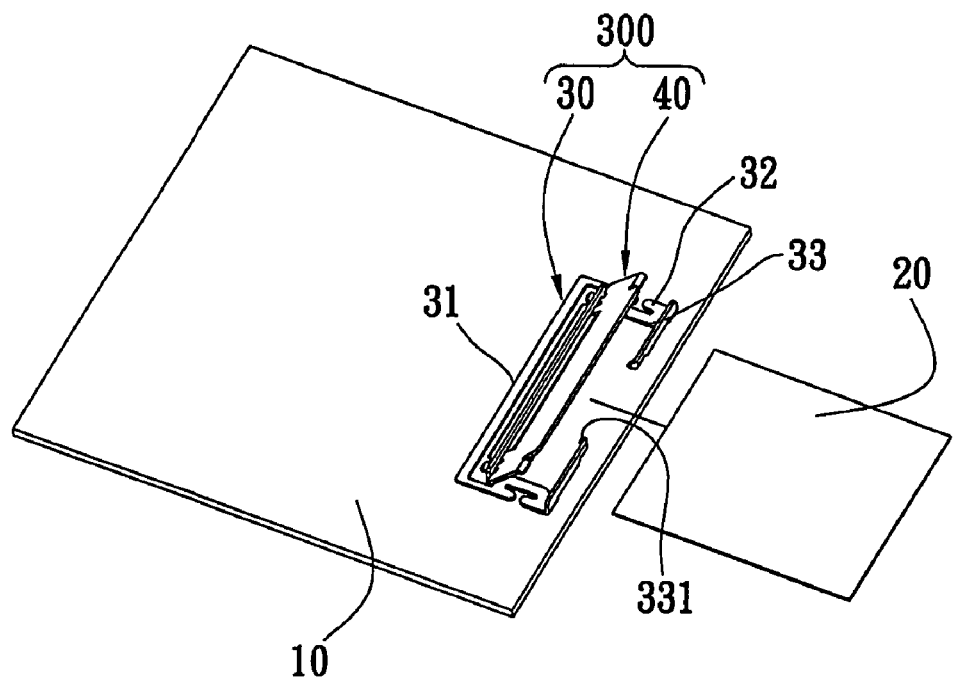
FIG. 3 is a first assemble isometric view of the present invention.
Figure 4:
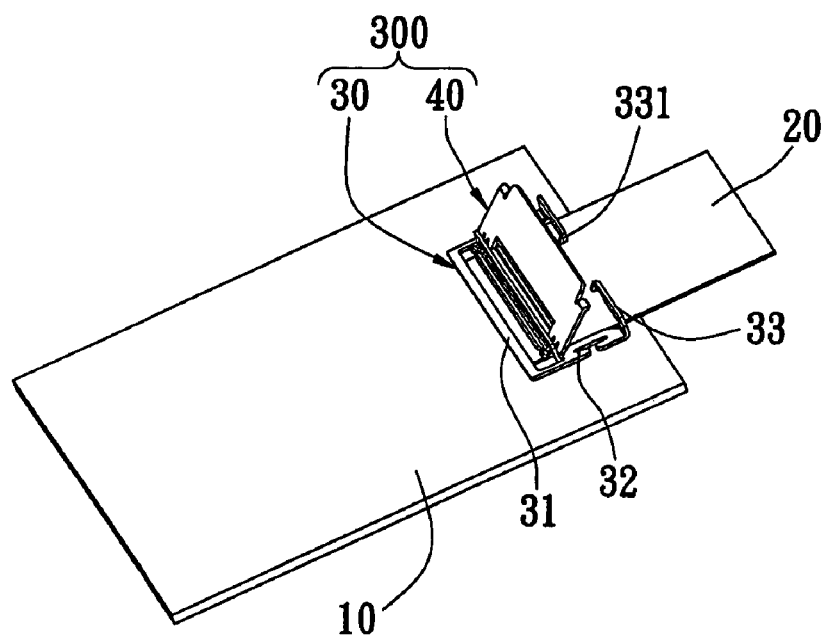
FIG. 4 is a second assemble isometric view of the present invention.
Figure 5:
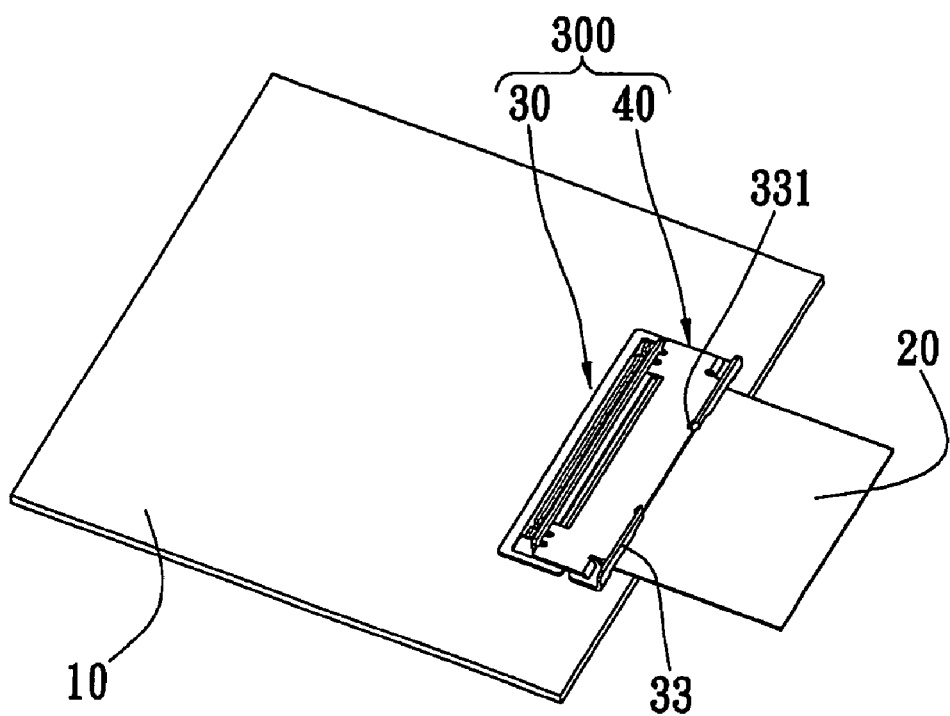
FIG. 5 is a third assemble isometric view of the present invention.

Referring to FIG. 2, the second electronic component 20 includes a plurality of electric cored wires 21 and insulating film 22 covering the cored wires 21. At least a partial area of the cored wires 21 is not covered by the insulating film 22. Thus, each cored wire 21 has a bare contacting area. For the embodiment of the present invention, a rectangular hole 23 is defined on a surface of the insulating film 22 to expose the cored wires 21. Furthermore, a plurality of conductive substrates 101 are set on the surface of the first electronic component 10 corresponding to the contacting area.

Referring to FIG. 1 again, the press-fit device 300 of the present invention includes a fixing plate 30, a press-fit piece 40 and a flexible insulator 50. The fixing plate 30 is inverted U-shaped and includes a base portion 31, two side portions 32, two flexible arms 33 and a bearing portion 34. The two side portions 32 are connected with both ends of the base portion 31 respectively. The two flexible arms 33 are formed by outside ends of the two side portions 32 extending inwards thereof. Tail ends of the two flexible arms 33 bend inwards to form clasping portions 331. The base portion 31 bends upwards to form the bearing portion 34 and defines a square hole 341 thereon. The bearing portion 34 is disposed opposite to the flexible arm 33. Thereby, a width between the two side portions 32 is greater than a width of the connecting end of the second electronic component 20.

Figure 6:
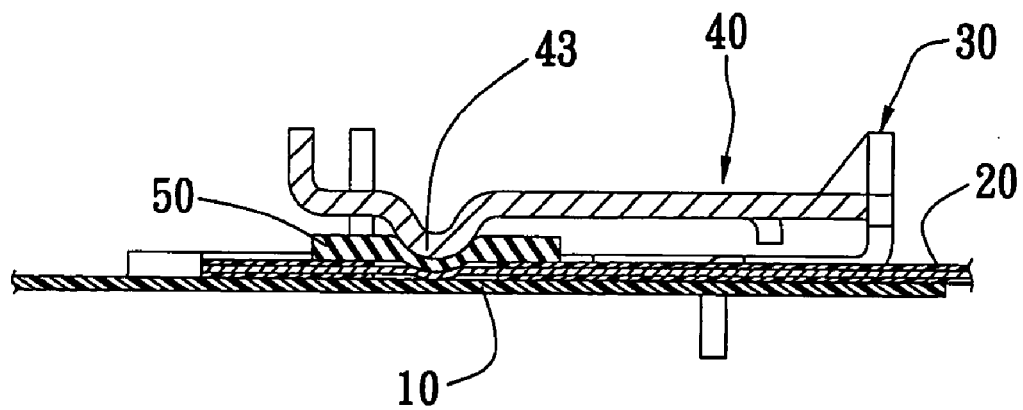
FIG. 6 is a cut-way view of the present invention.

The press-fit piece 40 is flat. One end of the press-fit piece 40 bends upwards and extends to form a curved portion 41. Flexible snap portions 42 are defined on both sides of the curved portion 41 respectively. The press-fit piece 40 protrudes downwards near to the curved portion 41 to form a press-fit portion 43 (shown in FIG. 6). Another end of the press-fit piece 40 extends downwards to form a supporting portion 44, which is opposite to the curved portion 41. The flexible insulator 50 is strip-shaped and can be made of rubber, plastic or other similar materials.

The fixing plate 30 is fixed onto a front end of the first electronic component 10 by a process such as welding. The press-fit piece 40 defines an axis thereon fixed on the fixing plate 30. The axis can rotate and produce a press-fit force. The curved portion 41 and the flexible snap portions 42 of the press-fit piece 40 are inserted through the square hole 341 of the fixing plate 30. Thus, the flexible snap portions 42 are inserted into the bearing portion 34 and a counterforce is produced to prevent the press-fit piece 40 from deviating from the fixing plate 30 when pulled. The flexible insulator 50 can be fixed on an undersurface of the press-fit piece 40 or a top surface of the second electronic component 20.

Referring to FIGS. 3-6, when the press-fit piece 40 is opened, the clearance between the press-fit portion 43 and the first electronic component 10 is greater than the thickness of the second electronic component 20. The second electronic component 20 can be inserted towards the press-fit device 300. Both sides of the second electronic component 20 are located between both side portions 32 of the fixing plate 30, and the two side portions 32 limit the position of the second electronic component 20. When the press-fit piece 40 is rotated to a closed position a front end of the press-fit piece 40 can clasp the clasping portions 331 of the fixing plate 3 to retain the press-fit piece 40 in place. At the same time, the press-fit portion 43 presses the flexible insulator 50 (shown in FIG. 6), and the flexible insulator 50 further presses and fits the contacting area and the conductive substrate of the second electronic component 20 elastically. Thus, the first electronic component 10 can be connected electronically with the second electronic component 20.

It is important to note that if the clearance between the press-fit portion 43 and the fixing plate 30 is small, and the fixing plate 30 and the press-fit piece 40 are assembled first, when assembling the press-fit device 300 onto the first electronic component 10, a vacuum slot (not shown) can be used to suck the press-fit device 300. In the assembling process, no shaking occurs on the press-fit piece 40. Next, the fixing plate 30 is welded onto the first electronic component 10 to make the assembly exact, and the press-fit device 300 is set onto the first electronic component 10 more firmly.

The press-fit device 300 of the present invention includes the fixing plate 30 and the press-fit piece 40. The press-fit piece 40 provides equal clamping force to clamp the second electronic component 20. The second electronic component 20 is electronically connected with a circuit board, such as the first electronic component 10, and forms a fine connection. In addition, because the rotatable axis of the press-fit piece 40 is set on the fixing plate 30, operation is easy, assembly and disassembly of the second electronic component 20 are also easy, distortion or rupture won't occur due to the continual pull acted upon the press-fit piece 40. Furthermore, the fixing plate 30 and the press-fit piece 40 are flat, so the overall height is reduced, so that smaller electronic products can be used. Moreover, the flexible insulator 50 is set between the second electronic component 20 and the press-fit piece 40, so the electronic contact between the second electronic component 20 and the first electronic component 10 is closer, and the force is more equal.

What is disclosed above are only the preferred embodiments of the present invention, and therefore it is intended that the present invention not be limited to the particular embodiment disclosed. It should be understood by those skilled in the art that various equivalent changes may be made depending on the specification and the drawings of present invention without departing from the scope of the present invention.

What is claimed is:

1. A press-fit device for connecting two components together, the press-fit device comprising:
    a first electronic component having a plurality of conductive substrates;
    a second electronic component having a contact area;
    a fixing plate fixed on the first electronic component having a bearing portion set on one side thereof and the bearing portion having a substantially square hole receiving at least a portion of said second electronic component therein with the contact area being in corresponding relationship to the plurality of conductive substrates;
    a press-fit piece being mounted to said fixing plate about a rotatable axis to permit rotational displacement of said press-fit piece with respect to said fixing plate, said press-fit piece having a pair of flexible snap portions set on opposing sides thereof, the press-fit piece and said flexible snap portions being inserted through said substantially square hole, the flexible snap portions being received in said bearing portion; and
    a flexible insulator set between the press-fit piece and the second electronic component;
    whereby the press-fit piece presses the flexible insulator, and further flexibly presses the contact area of the second electronic component to the plurality of conductive substrates of the first electronic component.

2. The press-fit device as claimed in claim 1, wherein the first electronic component is a circuit board.

3. The press-fit device as claimed in claim 1, wherein the second electronic component is a flexible flat cable, the flexible flat cable includes a plurality of cored wires and an insulating film covering the cored wires, and the contact area being defined by a portion of the cored wires uncovered by the insulating film.

4. The press-fit device as claimed in claim 1, wherein the fixing plate includes a base portion and two side portions connected with two ends of the base portion respectively, the second electronic component is positioned between the two side portions.

5. The press-fit device as claimed in claim 1, wherein a pair of flexible arms is formed on an opposing side of the fixing plate, and each flexible arm extends inwardly and a tail end of the flexible arm bends inwards to form a clasping portion to clasp the press-fit piece.

6. The press-fit device as claimed in claim 1, wherein the flexible insulator is fixed on the second electronic component.

7. The press-fit device as claimed in claim 1, wherein the flexible insulator is fixed on the press-fit piece.

8. A press-fit device for connecting two electronic components together, the press-fit device comprising:
   a circuit board having a plurality of conductive substrates;
   a flexible cable having a plurality of cored wires covered by an insulating film and a contact area defined by an uncovered portion of the cored wires;
   a fixing plate fixed on the first electronic component having a bearing portion set on one side thereof and the bearing portion having a substantially square hole receiving a portion of said flexible cable therein with the contact area being in corresponding relationship to the plurality of conductive substrates; and
   a press-fit piece being mounted to said fixing plate about a rotatable axis to permit rotational displacement of said press-fit piece with respect to said fixing plate, said press-fit piece having a flexible snap portion set on opposing sides thereof, the press-fit piece and said flexible snap portion being inserted through said substantially square hole, being received in said bearing portion;
   whereby the press-fit piece presses said flexible cable to make the contact area press flexibly with the conductive substrates of the circuit board.

9. The press-fit device as claimed in claim 8, further comprising a flexible insulator set between the flexible flat cable and the press-fit piece, the press-fit piece presses the flexible insulator and the flexible flat cable.

10. The press-fit device as claimed in claim 9, wherein the flexible insulator is fixed with the flexible flat cable.

11. The press-fit device as claimed in claim 9, wherein the flexible insulator is fixed with the press-fit piece.

12. The press-fit device as claimed in claim 8, wherein the fixing plate has a base portion and two side portions are connected with two ends of the base portion respectively, and said flexible cable is positioned between the two side portions.

13. The press-fit device as claimed in claim 8, wherein a pair of flexible arms is formed on an opposing side of the fixing plate, and each flexible arm extends inwardly and a tail end of the flexible arm bends inwards to form a clasping portion to clasp the press-fit piece.

* * * * *